(12) United States Patent
Medding et al.

(10) Patent No.: US 7,719,125 B2
(45) Date of Patent: May 18, 2010

(54) METHOD FOR DETACHING A SEMICONDUCTOR CHIP FROM A FOIL AND DEVICE FOR MOUNTING SEMICONDUCTOR CHIPS

(75) Inventors: Jonathan Medding, Birmensdorf (CH); Martina Lustenberger, Hagendorn (CH); Marcel Niederhauser, Steinhausen (CH); Daniel Schnetzler, Unteraegeri (CH); Roland Stalder, Zurich (CH)

(73) Assignee: Unaxis International Trading Ltd., Cham (CH)

( * ) Notice: Subject to any disclaimer, the term of this patent is extended or adjusted under 35 U.S.C. 154(b) by 534 days.

(21) Appl. No.: 11/805,661

(22) Filed: May 23, 2007

(65) Prior Publication Data

US 2007/0228539 A1 Oct. 4, 2007

Related U.S. Application Data

(62) Division of application No. 11/101,750, filed on Apr. 8, 2005, now Pat. No. 7,238,593.

(30) Foreign Application Priority Data

Apr. 13, 2004 (EP) .................................. 04101498
Jun. 29, 2004 (EP) .................................. 04103054
Nov. 29, 2004 (EP) .................................. 04106169

(51) Int. Cl.
*H01L 23/58* (2006.01)

(52) U.S. Cl. .............................. 257/798; 257/E21.499; 257/678; 438/464; 438/106; 156/344

(58) Field of Classification Search .......... 257/E21.499, 257/E23.003, E23.177, 678, 798; 438/106, 438/107, 464; 414/786, 403, 811; 156/344, 156/379.6; 29/832, 840, 426.1, 426.3, 426.5, 29/564.1
See application file for complete search history.

(56) References Cited

U.S. PATENT DOCUMENTS 4,589,182 A * 5/1986 Imai ........................... 29/410

(Continued)

FOREIGN PATENT DOCUMENTS

DE 2008 34 6/1983

(Continued)

*Primary Examiner*—Chris C Chu
(74) *Attorney, Agent, or Firm*—Nixon Peabody LLP; David B. Ritchie

(57) ABSTRACT

The detachment of a semiconductor chip (1) from a foil (4) and picking the semiconductor chip (1) from the foil (4) takes place with the support of a chip ejector (6), that has a ramp (16), the surface (17) of which is formed concave and ends at a stripping edge (18) projecting from the surface (9) of the chip ejector (6), and a support area (13) with grooves (12) arranged next to the stripping edge (18). Vacuum can be applied to the grooves (12). The detachment and picking of the semiconductor chip (1) from the foil (4) takes place in that the wafer table (5) is shifted relative to the chip ejector (6) in order to pull the foil (4) over the stripping edge (18) protruding from the surface (9) of the chip ejector (6), whereby the semiconductor chip (1) temporarily detaches itself at least partially from the foil (4) and lands on the foil (4) above the support area (13), and in that the chip gripper (7) picks the semiconductor chip (1) presented on the support area (13).

14 Claims, 7 Drawing Sheets

U.S. PATENT DOCUMENTS

| | | | |
|---|---|---|---|
| 4,778,326 A | 10/1988 | Althouse et al. | 414/786 |
| 4,921,564 A | 5/1990 | Moore | 156/344 |
| 5,098,501 A * | 3/1992 | Nishiguchi | 156/275.5 |
| 5,966,903 A | 10/1999 | Dudderar et al. | 53/397 |
| 6,039,833 A * | 3/2000 | Freund et al. | 156/344 |
| 6,561,743 B1 * | 5/2003 | Nakatsu | 414/403 |
| 6,629,553 B2 * | 10/2003 | Odashima et al. | 156/584 |
| 6,709,543 B2 * | 3/2004 | Kurosawa | 156/344 |
| 6,843,879 B1 * | 1/2005 | Huang et al. | 156/344 |
| 6,889,427 B2 * | 5/2005 | Yee et al. | 29/832 |
| 7,238,258 B2 * | 7/2007 | Park et al. | 156/344 |
| 7,240,422 B2 * | 7/2007 | Cheung et al. | 29/762 |
| 2002/0129899 A1 * | 9/2002 | Mimata et al. | 156/344 |
| 2003/0077880 A1 * | 4/2003 | Shinjo et al. | 438/462 |
| 2004/0105750 A1 | 6/2004 | Bolliger et al. | 414/811 |
| 2005/0274457 A1 * | 12/2005 | Cheung et al. | 156/344 |

FOREIGN PATENT DOCUMENTS

JP  4-320046  11/1994

* cited by examiner

METHOD FOR DETACHING A SEMICONDUCTOR CHIP FROM A FOIL AND DEVICE FOR MOUNTING SEMICONDUCTOR CHIPS

PRIORITY CLAIM

This application is a divisional of and commonly assigned U.S. patent application Ser. No. 11/101,750 filed on Apr. 8, 2005 now U.S. Pat. No. 7,238,593, in the name of Jonathan Medding, Martina Lustenberger, Marcel Niederhauser, Daniel Schnetzler and Roland Stalder and entitled "Method For Detaching A Semiconductor Chip From A Foil And Device For Mounting Semiconductor Chips", which claims priority under 35 U.S.C §119 based upon European Patent Application No. 04101498.6 filed on Apr. 13, 2004, European Patent Application No. 04103054.5 filed on Jun. 29, 2004 and European Patent Application No. 04106169.8 filed on Nov. 29, 2004, the disclosures of which are hereby incorporated herein by reference as if set forth fully herein.

FIELD OF THE INVENTION

The invention concerns a method for detaching a semiconductor chip from a foil and an apparatus for mounting semiconductor chips that is suitable for carrying out the method.

BACKGROUND OF THE INVENTION

Typically, the semiconductor chips are presented on a foil held in a frame, also known in the trade as a tape, for processing with such a mounting apparatus. The semiconductor chips adhere to the foil. The frame with the foil is accommodated by a movable wafer table. The wafer table is shifted in cycles so that one semiconductor chip after the other is presented at a first location A and then the presented semiconductor chip is picked up by a chip gripper and placed at a second location B on a substrate. Removal of the presented semiconductor chip from the foil is supported by a chip ejector (known in the trade as a die ejector) arranged underneath the foil. In doing so, as a rule at least one needle arranged in the chip ejector supports detachment of the semiconductor chip from the foil.

From the U.S. Pat. No. 4,921,564, a method has become known with which the semiconductor chips can be detached from the foil and picked up by the chip gripper without the aid of a needle. With this method, the foil with the semiconductor chips is placed onto a heatable plate. On the side facing towards the foil, the plate has cavities to which vacuum can be applied. When mounting, on the one hand vacuum is applied to the cavities so that the foil is pulled into the cavities and is partly detached from the semiconductor chips. On the other hand, in order to additionally reduce the adhesion of the semiconductor chips to the foil, the foil is heated to a temperature of 50° C. to 65° C. This method works for numerous semiconductor chips however, with comparatively large but very thin semiconductor chips, it often happens that, on applying the vacuum and removing the foil, the semiconductor chips lift and then fall back onto the foil whereby it can also happen that adjacent semiconductor chips overlap.

The thickness of the semiconductor chips to be detached continuously decreases. Today, in many cases the thickness already only amounts to 100 micrometers with the trend to further reduced thicknesses of 75 to 50 micrometers. In addition to this, there is an adhesive layer on the back of the wafers. The adhesion of the semiconductor chips on the wafer is therefore increased. The technology described above with which the semiconductor chips are detached with the aid of needles is reaching its limits. The detachment of the foil with vacuum in accordance with U.S. Pat. No. 4,921,564 also doesn't work any more: the foil can no longer be heated to the required temperature of 50° C. to 65° C. because at these temperatures the adhesive layer hardens so that the semiconductor chips adhere even better to the foil.

A further method for detaching a semiconductor chip from a foil is known from U.S. Pat. No. 6,561,743. With this method, the foil with the semiconductor chip to be detached is pulled over an edge whereby the semiconductor chip and the foil are detached from each other on the edge. Detachment of the foil is stopped before the semiconductor chip has completely detached itself from the foil. In order to control detachment of the semiconductor chip from the foil, the chip gripper is first lowered onto the semiconductor chip and vacuum is applied to the semiconductor chip. The foil is then pulled over the edge until the semiconductor chip has completely detached itself from the foil. A similar method is known from U.S. Patent Application Publication No. 2002/0129899. These methods have the disadvantage that adjacent semiconductor chips can be damaged because the height of the edge necessary for detachment has to be about 1.5 millimeters.

An object of the present invention is to develop a robust method for the detachment of semiconductor chips from a foil with which adjacent semiconductor chips are not damaged.

BRIEF DESCRIPTION OF THE INVENTION

An apparatus in accordance with the invention for the mounting of thin semiconductor chips that adhere to a foil comprises a wafer table that accommodates the foil with the semiconductor chips and a chip ejector that, on the surface facing towards the foil, has a ramp corresponding to the width of the semiconductor chips to be detached with a stripping edge on which the semiconductor chip is detached from the foil. The surface of the ramp is formed concave and, at the stripping edge, reaches a maximum height of only about 0.3 millimeters. Preferably, the surface is a cylindrical area as this has a constant curvature. With this concave shape of the ramp, the angle between the underneath of the semiconductor chip and the foil is increased at the stripping edge of the ramp and therefore the force necessary to detach the foil from the semiconductor chip is reduced. Therefore, the height of the stripping edge can be reduced to the given height of only 0.3 to 0.4 millimeters. Next to the stripping edge there is a support area with grooves. The grooves run parallel to the detachment direction or orthogonally to the stripping edge, respectively, and vacuum can be applied to them. The wafer table is movable in two orthogonal directions.

Detachment of the semiconductor chips from the foil and picking up with the chip gripper takes place as follows: To begin with, three procedure steps are carried out in order to align the first semiconductor chip to be detached in relation to the ramp:

1. Moving the wafer table in the first direction until a front edge of the first semiconductor chip to be detached runs parallel and along the stripping edge of the ramp,
2. Moving the wafer table in the second direction until the first semiconductor chip to be detached is centred in relation to the lateral edges of the ramp, and
3. Applying vacuum to the grooves of the support area so that the foil is pulled against the support area.

In the next procedure step the first semiconductor chip is detached from the foil and presented for picking up by the chip gripper.

4. Moving the wafer table in the first direction by a predetermined distance that is typically about one to two millimeters longer than the length of the semiconductor chip to be detached.

With this procedure step, the foil is pulled over the stripping edge of the ramp. The semiconductor chip is moved with it. In doing so, the foil detaches itself from the underneath of the semiconductor chip. The part of the semiconductor chip detached from the foil hangs at an angle in the air like a plate supported on only one side. When the rear end of the semiconductor chip reaches the stripping edge of the ramp, then the semiconductor chip falls back onto the foil. The semiconductor chip however, is now located above the support area where the foil is pulled into the grooves of the support area. The adhesion of the semiconductor chip to the foil is therefore greatly reduced.

Because the length of the forward feed was about one to two millimeters longer than the length of the detached semiconductor chip, the second semiconductor chip to be detached already protrudes beyond the stripping edge of the ramp.

The first detached semiconductor chip now lies on the support area ready to be picked up by the chip gripper. The position and orientation of this semiconductor chip are now measured by means of a camera. If the deviation of the measured actual position from the set position exceeds a predetermined tolerance limit, the wafer table is shifted until the deviation of the actual position of the semiconductor chip from the set position lies within the predetermined tolerance limit. This procedure step has nothing to do with the actual detachment process from the foil. The apparatus is now ready so that the chip gripper can pick up the first semiconductor chip from the foil and place it onto the substrate. In the next procedure step, picking of the semiconductor chip by the chip gripper takes place, for example as follows:

5. Lowering the chip gripper onto the semiconductor chip presented on the support area, applying vacuum and a predetermined pick force to the chip gripper and raising the chip gripper.

Because the distance between the semiconductor chips is very small, under certain circumstances it can be necessary or meaningful to lower the ramp before procedure step 5 so that the chip gripper can pick up the semiconductor chip without the next semiconductor chip being touched by the chip gripper.

As the chip gripper has now picked up the semiconductor chip, the next semiconductor chip can be detached from the foil and presented on the support area for picking up by the chip gripper. The wafer table is therefore shifted in the first direction by the length of the semiconductor chip and the average width of the saw tracks.

The semiconductor chips present on the foil are processed row for row whereby the first semiconductor chip of a row is always aligned in relation to the ramp in accordance with the procedure steps 1 and 2.

The method for picking a thin semiconductor chip from a foil is therefore characterised in that the detachment of the semiconductor chip from the foil and the picking of the semiconductor chip by a chip gripper takes place in two from each other independent, successive procedure steps. After detachment, the semiconductor chip again lands on the foil. However, because the greater part of the foil is pulled into the grooves in the support area, the contact area between the foil and the semiconductor chip is significantly reduced. Correspondingly, the adhesion of the semiconductor chip to the foil is also reduced and the semiconductor chip can easily be picked up by the chip gripper.

Preferably, ultrasound can be applied to the ramp with the stripping edge so that the detachment process can be supported by ultrasound. Furthermore, it is advantageous when the height of the stripping edge is adjustable so that the height can be reduced immediately before the semiconductor chip is completely detached from the foil.

The invention offers several advantages:

Because, with typically 0.3 millimeters, and at most 0.4 millimeters, the height difference at the stripping edge of the ramp is very small, therefore adjacent semiconductor chips are not damaged even when their edge is also moved over the ramp.

Because the chip gripper does not have to support detachment of the semiconductor chip from the foil, the time required for a bond cycle is independent of the detachment process.

Because the support area with the grooves does not interfere with adjacent semiconductor chips, the support area can be formed with a wide area so that the same one can be used for small as well as for large semiconductor chips.

Ideally, the width of the ramp corresponds to the width of the semiconductor chips. The ramp is therefore preferably formed as an exchangeable insert that is inserted into a cavity in the chip ejector to which vacuum can be applied.

In procedure step 4 the wafer table is shifted and therefore moved relative to the chip ejector. Alternatively, the chip ejector can be shifted because it is only a matter of a relative movement between the wafer table and the chip ejector.

The method described works perfectly for numerous foil types and adhesive coatings of the wafer. However, there are now adhesives that locally become liquid on sawing the wafer into the semiconductor chips because of the heat created by sawing. This has the result that the adhesive in the area of the edges of the semiconductor chips combines with the foil and/or adjacent semiconductor chips are still connected to one another by means of adhesive (i.e., the separation of the adhesive layer between the semiconductor chips is not complete). On the other hand, there are foils that are very elastic. When the foil is held by vacuum on the support area, then, on shifting the wafer table, the foil is not pulled over the ramp but becomes distorted. To solve these problems, the invention proposes special measures that are now explained.

One measure in order to support detachment of the semiconductor chip from the foil exists in equipping the chip ejector with needles that can be raised and lowered. The needles are for example arranged in a needle block. The needles are preferably formed with rounded heads so that they do not penetrate the foil. The procedure step 5 explained above is replaced by the following procedure step 5A.

5A. Lowering the chip gripper onto or a small distance above the semiconductor chip presented on the support area, raising the needle block with the needles until the needles press the foil against the semiconductor chip and then simultaneously raising the needle block and the chip gripper.

In doing so, the foil is increasingly detached from the underneath of the semiconductor chip, as it is pulled into the grooves in the support area by vacuum, until the foil is detached from the semiconductor chip with exception of the pieces of foil between the heads of the needles and the semiconductor chip.

As such, procedure step 5A can be carried out as is usual in prior art, preferably in accordance with the method described in the US patent application US 2004/0105750 to which explicit reference is made here.

There are also applications with which it is advantageous not to detach the foil from the entire underneath of the semiconductor chip but for example only from 90% of the underneath. To do so, the ramp is lowered as soon as the foil has been detached by 90%. The wafer table is now shifted further with lowered ramp until the front edge of the next semiconductor chip has reached the stripping edge of the ramp. The ramp is now raised again and the wafer table shifted further until the semiconductor chip to be detached has reached its set position above the support area. In doing so, the foil is correctly detached from the next semiconductor chip. Picking the semiconductor chip from the support area is done with the aid of the needles.

One measure in order to avoid the distortion of the foil exists in detaching the foil in small steps without vacuum being applied to the support area. To do so, time and again the vacuum on the support area is suspended, the wafer table is shifted by a fraction of the length of the semiconductor chip and then vacuum applied to the support area. In this way, the foil is detached piece by piece from the new forward fed length of the semiconductor chip.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures of the drawings are not to scale.

DETAILED DESCRIPTION OF THE INVENTION

Figure 1:
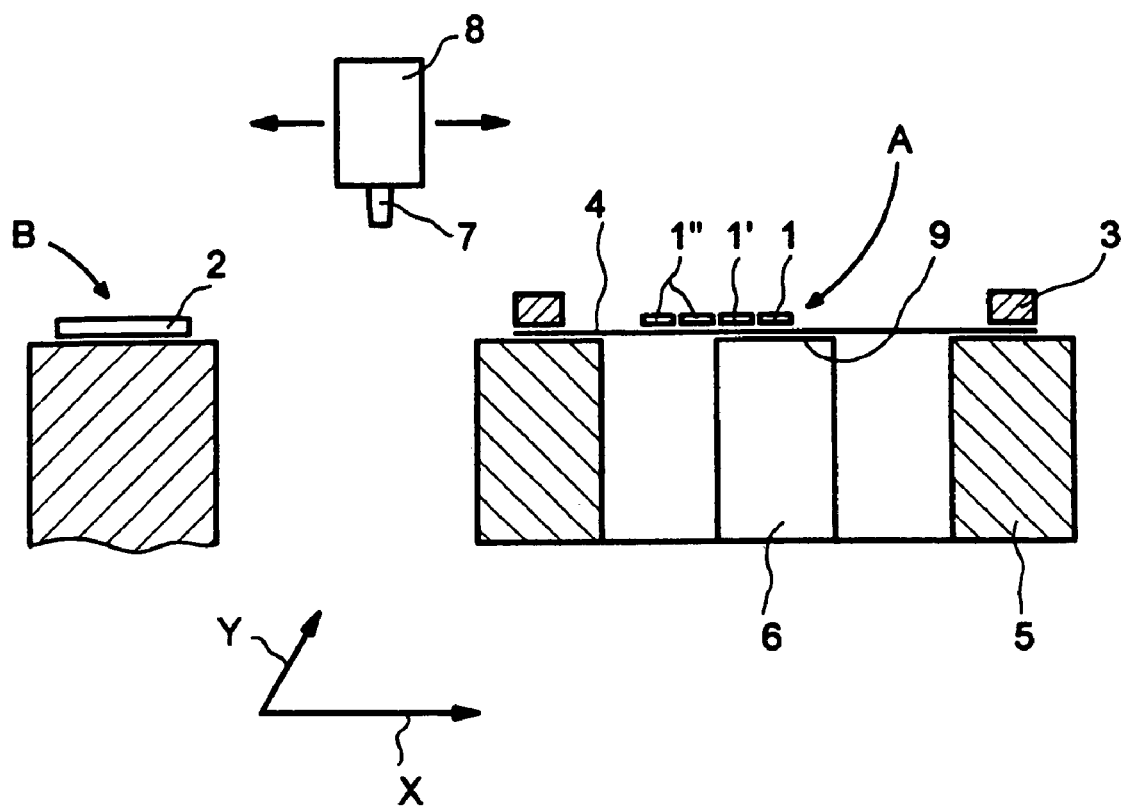
FIG. 1 illustrates an apparatus for mounting semiconductor chips with a chip ejector in accordance with the invention.

FIG. 1 shows a simplified, schematic representation of an apparatus for mounting semiconductor chips 1, 1', 1" onto a substrate 2. The semiconductor chips 1, 1', 1" arranged in rows and columns adhere to a foil 4 held for example in a frame 3. The apparatus has a movable wafer table 5, that accommodates the frame 3 and presents one semiconductor chip 1 after the other at a first location A. At the first location A, a chip ejector 6 in accordance with the invention, in this example one without needles, is arranged underneath the foil 4. On removal of the semiconductor chip 1, the chip ejector 6 serves to support its detachment from the foil 4. The wafer table 5 is movable in two orthogonal directions x and y. The foil 4 is arranged so that the edges of the semiconductor chips 1, 1', 1'" are almost parallel to the directions x and y. The apparatus also has a chip gripper 7 for transporting the semiconductor chip 1 presented at the first location A to a second location B located on the substrate 2. The chip gripper 7 is a component part of a raisable and lowerable bondhead 8. The bondhead 8 and the chip gripper 7 are moved together back and forth between the location A and the location B (or several locations $B_1$, $B_2$, etc.).

Figure 2:
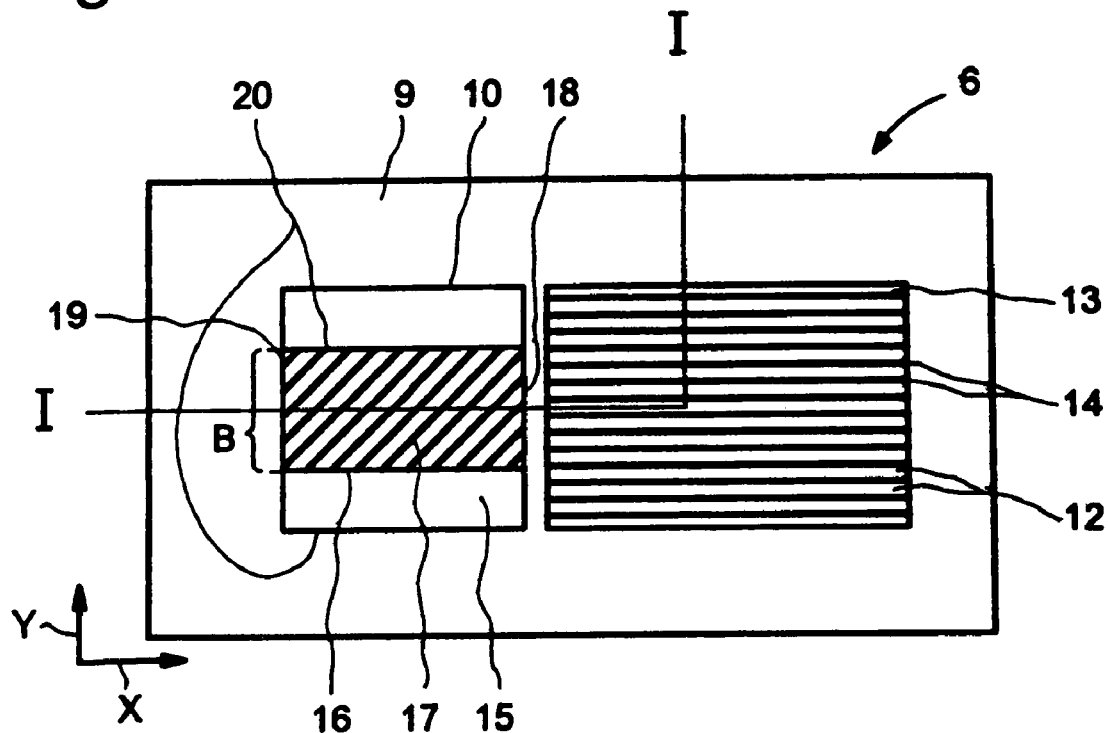
FIG. 2 shows a plan view of the chip ejector.
Figure 3:
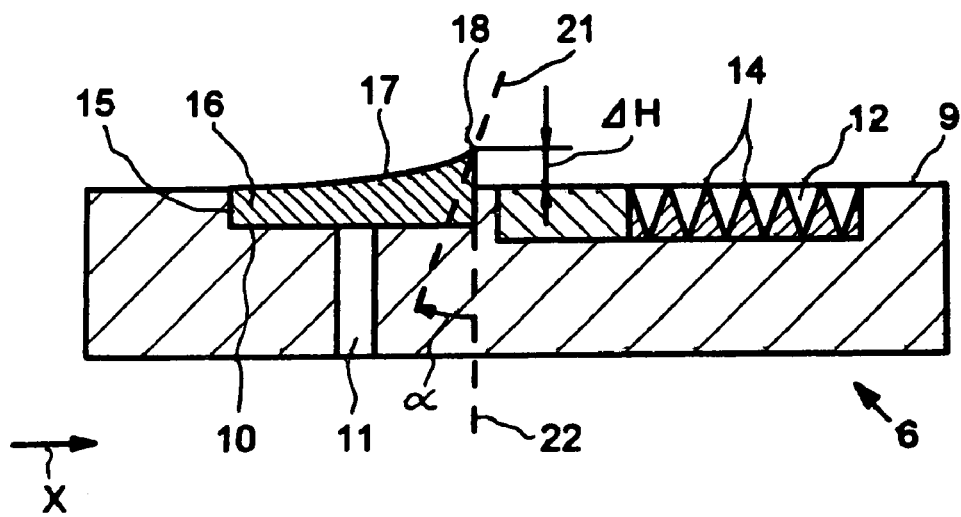
FIG. 3 shows a section of the chip ejector along the line I-I of FIG. 2.

FIG. 2 shows a plan view of the chip ejector 6, ie, the surface 9 of the chip ejector 6 facing towards the foil 4 (FIG. 1). FIG. 3 shows a section of the chip ejector 6 along the line I-I of FIG. 2. The surface 9 of the chip ejector 6 contains a recess 10, into which a drill hole 11 to which vacuum can be applied opens out, and a support area 13 with parallel arranged grooves 12. The grooves 12 run in x direction and the tips 14 of the grooves 12 are flush with the surface 9 of the chip ejector 6. On the one hand, the distance between the grooves 12 is large enough that the foil 4 is pulled into the grooves 12 when vacuum is applied to the grooves 12 and, on the other hand, is small enough so that an adjacent semiconductor chip that lies at least partially on the support area 13 will not be damaged as the foil 4 is not pulled into the grooves 12 when the foil 4 has not been previously detached from the semiconductor chip. An insert 15 that contains a ramp 16 with a concave surface 17 is inserted with exact fit into the recess 10. One side of the ramp 16 forms a protruding stripping edge 18, on which the foil 4 is detached from the semiconductor chip 1. The opposite side 19 of the ramp 16 is flush with the surface 9 of the chip ejector 6. The concave surface 17 is preferably the surface of a cylinder the longitudinal axis of which runs parallel to the stripping edge 18 and that has for example a radius of 8 millimeters. The width B of the ramp 16 corresponds roughly to the width of the semiconductor chips to be detached. The height difference ΔH between the stripping edge 18 and the support area 13 amounts to about 0.3 millimeters. It is important that the stripping edge 18 forms an abrupt transition to which the semiconductor chips are unable to adapt on forward feed of the wafer table 5 in x direction. The stripping edge 18 runs parallel to the y direction. The location A (FIG. 1) is located on the support area 13, preferably in its center.

The formation of the surface 17 of the ramp 16 as a concave surface has the effect that the angle α, that the tangent 21 applied on the concave surface on the stripping edge 18 and the vertical 22 enclose, can be selected distinctly smaller than 90°. The more acute the angle α, the better the foil 4 detaches itself from the semiconductor chip 1.

Detachment of the semiconductor chip 1 from the foil 4 takes place in accordance with the procedure steps described above. FIGS. 4 to 9 show successive snapshots during the detachment process and the subsequent pick process. FIGS. 4 to 9 only show the elements necessary for the understanding of the invention, namely the ramp 16 and the support area 13, as well as the foil 4 and semiconductor chips 1, 1' and 1" of a same row of the wafer to be detached in succession.

Figure 4:
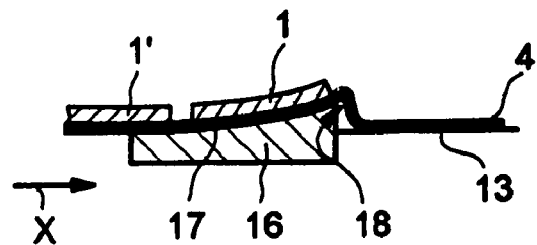
FIG. 4-9 show successive snapshots during detachment of the semiconductor chip from a foil and the picking of the detached semiconductor chip by means of a chip gripper in accordance with a first method.
Figure 5:
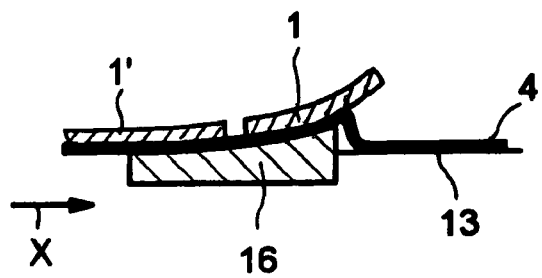
Figure 6:
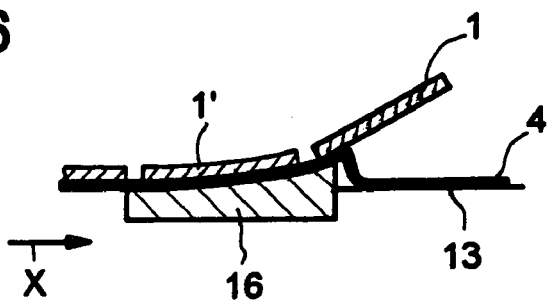

In accordance with the procedure steps 1 to 3, the wafer table is positioned so that a front edge of the first semiconductor chip 1 of a row of the wafer that is to be detached runs parallel to and along the stripping edge 18 of the ramp 16 and that the first semiconductor chip 1 of this row to be detached is centred in relation to the longitudinal edges 20 (FIG. 2) of the ramp 16. Furthermore, vacuum is applied to the grooves 12 of the support area 13 so that the foil 4 in this area is pulled into the grooves 12. This state is shown in FIG. 4. The wafer table 5 is now fed forward by a predetermined distance ΔL in the x direction. In doing so, the foil 4 is pulled over the stripping edge 18 of the ramp 16. The semiconductor chip 1 is moved with it. FIGS. 5 to 8 show successive snapshots during this forward feed. Because of the acute angle α that characterises the geometry of the stripping edge 18, the semiconductor chip 1 detaches itself from the foil 4 and the detached part stands in the air at an angle (FIGS. 5, 6). As soon as the rear end of the semiconductor chip 1 reaches the stripping edge 18 (FIG. 7), as a result of gravity the semiconductor chip 1 pivots on its rear edge and falls onto the foil 4 above the support area 13.

Figure 8:
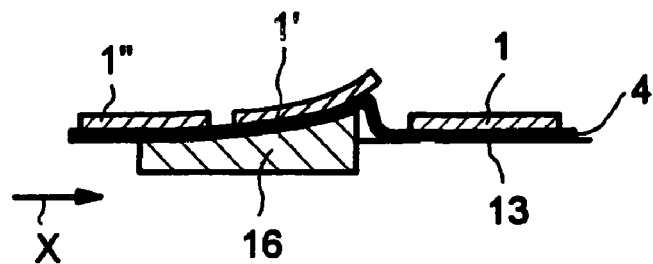

Because the length of the forward feed was about one to two millimeters longer than the length of the detached semiconductor chip 1, the next semiconductor chip 1' to be detached already projects beyond the stripping edge 18 of the ramp 16. This state is shown in FIG. 8.

Figure 9:
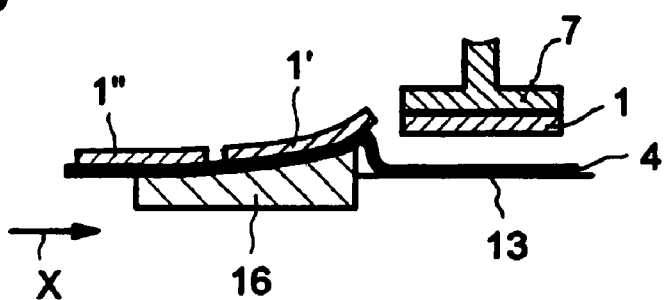

The first detached semiconductor chip 1 now lies on the foil 4 above the support area 13 ready for picking up by the chip gripper 7. The position and orientation of this semiconductor chip 1 are now measured by means of a camera. If the deviation of the measured actual position from the set position exceeds a predetermined tolerance limit, the wafer table 5 is shifted until the deviation of the actual position of the semiconductor chip 1 from the set position lies within the predetermined tolerance limit. This procedure step has nothing to do with the actual detachment process from the foil. The apparatus is now ready so that the chip gripper 7 can pick up the first semiconductor chip 1 from the foil 4 and place it onto the substrate 2 (FIG. 1). FIG. 9 shows the state immediately after picking of the semiconductor chip 1 by the chip gripper 7.

The embodiment described is designed so that the semiconductor chips 1 are presented at a fixed location A for picking by the chip gripper 7. The mounting apparatus can however also be designed so that the semiconductor chips are presented at different locations $A_1$, $A_2$, etc., and picked up by the chip gripper 7. In this case it is also possible that, instead of the wafer table 5, only the chip ejector 6 or the wafer table 5 and the chip ejector 6 are shifted by a suitable means in order to detach the foil 4 at the stripping edge 18 of the ramp 16 as, for detaching the foil 4 it is only a matter of a relative movement between the wafer table 5 and the stripping edge 18 of the ramp 16.

Figure 7:
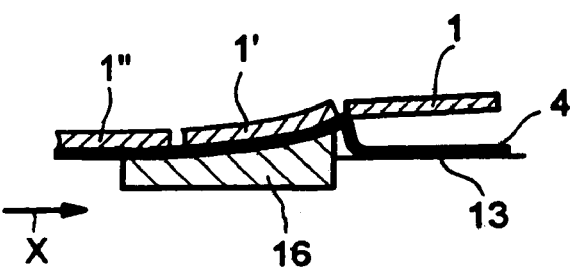
Figure 10:
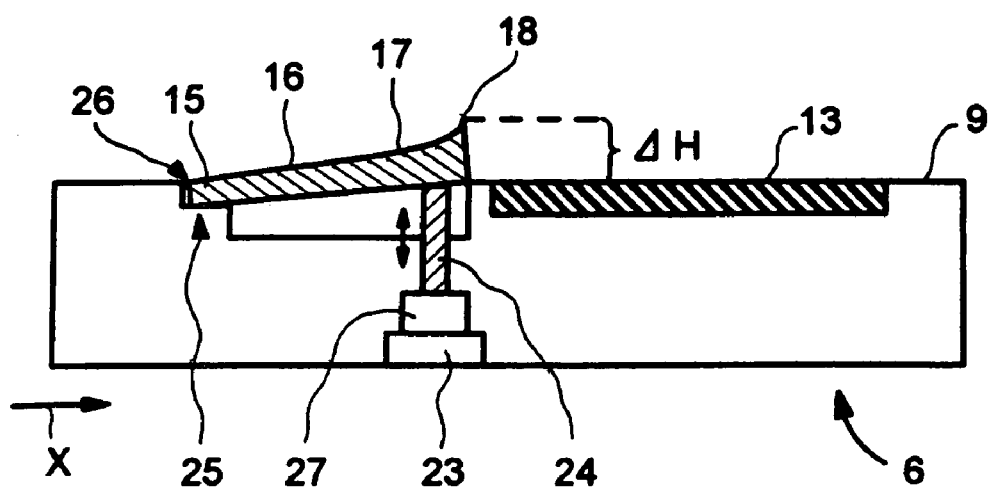
FIG. 10 illustrates a further example of the chip ejector.

FIG. 10 shows a further embodiment of the chip ejector 6 with which the height difference ΔH between the stripping edge 18 and the support area 13 is adjustable by means of a piston 24 that can be moved up and down by a drive 23. The piston 24 is arranged close to the stripping edge 18 so that, on raising the piston 24 the ramp 16 is turned on the edge 25 diagonally opposite the stripping edge 18 so that the edge 26 of the ramp 16 lying opposite the stripping edge 18 remains flush with the surface 9 of the chip ejector 6. This design enables an optimum adaptation of the height difference ΔH to the characteristics of the foil. In addition, this design enables a refinement of the detachment process in that in procedure step 4, the height difference ΔH at the start has a predetermined value $ΔH_1$ until the state presented in FIG. 6 is achieved. The piston 24 is now lowered so that the height difference ΔH has a smaller value $ΔH_2$. The height difference $ΔH_2$ is retained at least until the state presented in FIG. 7 is achieved where, as a result of gravity, the semiconductor chip 1 pivots on its rear edge whereby it is completely detached from the foil 4 and, as a result of gravity, falls onto the support area 13. Afterwards, the piston 24 is raised again so that the height difference ΔH again has the value $ΔH_1$. The value $ΔH_2$ can also be zero.

Furthermore the insert 15 is preferably coupled directly or as the case may be via the piston 24 to an ultrasonic transducer 27 so that the detachment process can be supported by ultrasound. A construction is also possible with which ultrasound is applied to the entire chip ejector 6.

Figure 11:
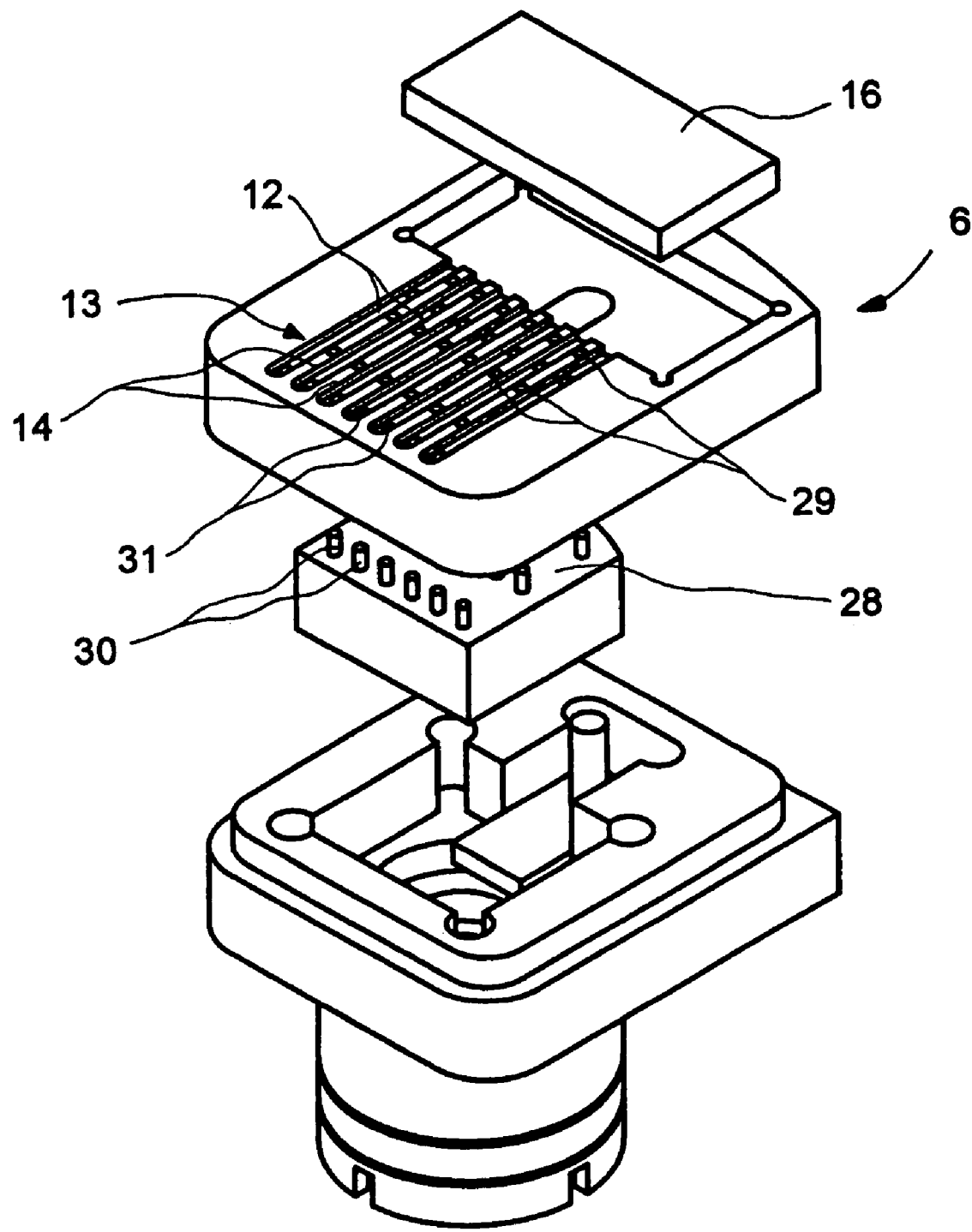
FIG. 11 shows a chip ejector with a needle block.

FIG. 11 shows an exploded view of an embodiment of the chip ejector 6 with a needle block 28. The tips 14 between the grooves 12 contain holes 29 through which the respective needles 30 of the needle block 28 protrude. The grooves 12 also contain holes 31 to which vacuum can be applied. In the assembled condition, the needle block 28 and the ramp 16 can be raised and lowered.

Figure 12:
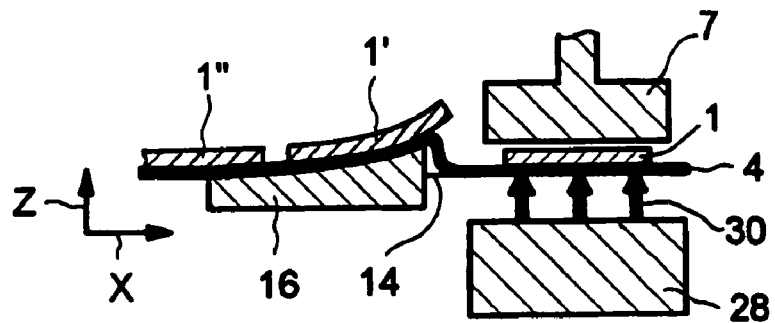
FIGS. 12-13 show picking the semiconductor chip with the support of needles.
Figure 13:
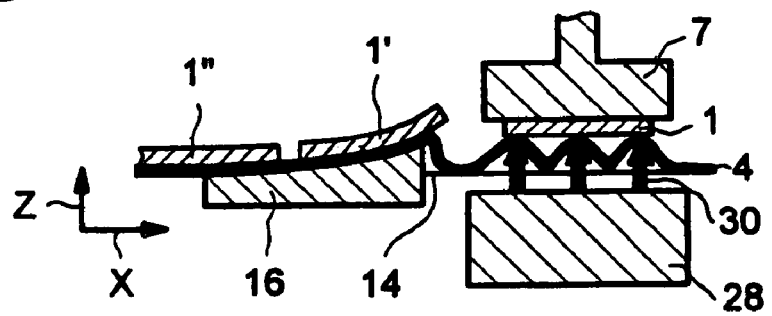

FIGS. 12 and 13 show the principle of the use of the needles 30 without details. The semiconductor chip 1 lies on the foil 4 above the support area 13 of the chip ejector 6. The chip gripper 7 is ready to pick up the semiconductor chip 1. The needle block 28 is raised in z direction so that the needles 30 raise the foil 4 locally without penetrating it. This state is shown in FIG. 12. As soon as the desired pick force has been reached, the chip gripper 7 and the needle block 28 are raised further together. In doing so, the foil 4 is largely detached from the underneath of the semiconductor chip 1, as the vacuum pulls the foil 4 down between the needles 30 into the grooves 12. Finally, the movement of the needle block 28 is stopped. This state is shown in FIG. 13. If the chip gripper 7 is raised further, then the semiconductor chip 1 finally detaches itself from the foil 4. With this example, the tips of the needles 30 are not pointed but round in such a way that they do not penetrate the foil 4.

As such, the needle block 28 can be used as is usual in the prior art. Preferably, the method described in U.S. Patent Application Publication No. 2004-0105750 is applied.

The method illustrated in FIGS. 4 to 8 with which the foil 4 is removed by 100% from the underneath of the semiconductor chip 1 can be modified in order to remove the foil 4 by a smaller percentage, for example by 80% or 90%, from the underneath of the semiconductor chip 1. FIG. 6 shows the state where the foil 4 is removed on a length of about 80% of the semiconductor chip 1. After the procedure steps 1 to 3 have been carried out, in procedure step 4A the foil 4 is not completely removed, in procedure step 4B the ramp 16 is lowered, in procedure step 4C the wafer table 5 is shifted further until the semiconductor chip 1 has reached the set position above the support area 13:

4A. Shifting the wafer table 5 in the first direction by a predetermined distance that is shorter than the length of the semiconductor chip 1 to be detached.

Figure 14:
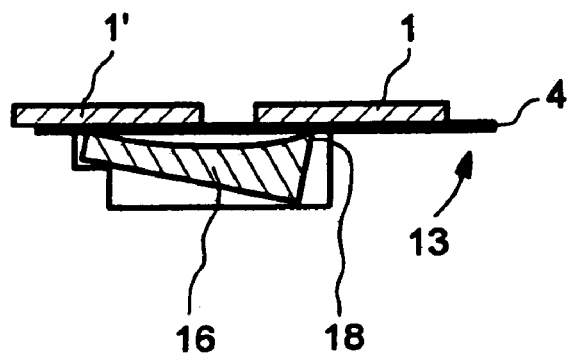
FIGS. 14-17 show snapshots during detachment of the semiconductor chip in accordance with further methods of the present invention.

4B. Lowering the ramp 16 so that the stripping edge 18 no longer projects beyond the support area 13. (This state is shown in FIG. 14.)

Figure 15:
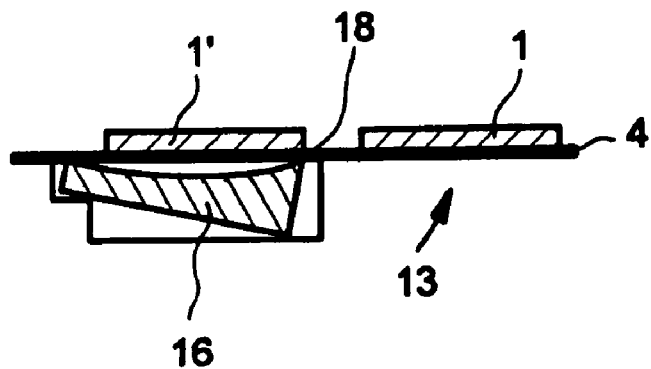

4C. Shifting the wafer table 5 in the first direction until the next semiconductor chip 1' has reached the stripping edge 18 of the ramp 16. (This state is shown in FIG. 15.)

4D. Raising the ramp 16.

4E. Shifting the wafer table 5 in the first direction until the semiconductor chip 1 has reached the set position above the support area 13. (This state is shown FIG. 8.)

Afterwards, picking of the semiconductor chip 1 is done by the chip gripper 7 with the support of the needles 30.

With the examples described up to now, vacuum is applied to the grooves 12 in the support area 13 while the wafer table 5 is shifted in order to remove the foil 4. This method is suitable for foils that slide over the support area 13. However there are also foils that do not slide over the support area 13 but are distorted. For such foils, the procedure step 3 is omitted and the procedure step 4 is modified as follows:

4AA. Shifting the wafer table 5 in the first direction by a predetermined short distance.

Figure 16:
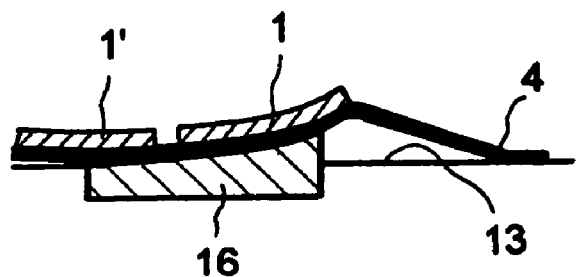

Because no vacuum is applied to the support area 13, the foil 4 is not pulled into the grooves 12 of the support area 13 and is therefore also not removed from the underneath of the semiconductor chip 1. FIG. 16 shows the state after carrying out the procedure step 4AA for the first time.

4BB. Applying vacuum to the support area 13.

Figure 17:
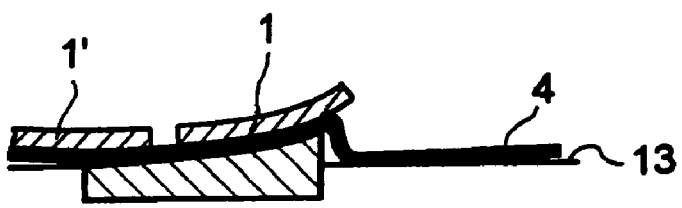

As soon as vacuum is applied to the support area 13, the foil 4 is pulled into the grooves 12 of the support area 13 and is therefore removed from the underneath of the semiconductor chip 1 protruding beyond the stripping edge 18. FIG. 17 shows the state after carrying out the procedure step 4BB for the first time.

4CC. Releasing the vacuum on the support area 13.

4DD. Repeating the procedure steps 4AA to 4CC until the foil 4 is removed from the semiconductor chip 1 completely or to the desired degree.

4EE. Releasing the vacuum on the support area 13 and shifting the wafer table 5 in the first direction until the next semiconductor chip 1' protrudes by the predetermined short distance beyond the stripping edge 18 of the ramp 16 and, if necessary, repeating the steps 4AA to 4CC until the semiconductor chip 1 has reached the set position above the support area 13.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting semiconductor chips on a substrate, the apparatus comprising:
    a wafer table (5) for accommodating a foil (4) with semiconductor chips;
    a chip ejector (6) having a support area (13) with grooves (12) and a ramp (16), a surface (17) of the ramp (16) formed concave and ending at a stripping edge (18) protruding from the surface (9) of the chip ejector (6);
    the wafer table (5) movable relative to the chip ejector (6); and
    a chip gripper for picking a semiconductor chip (1) presented on the support area (13) from the foil (4) and placing the semiconductor chip (1) on the substrate.

2. The apparatus according to claim 1, wherein the stripping edge (18) protrudes by a maximum of 0.4 millimeters from the surface (9) of the chip ejector (6).

3. The apparatus according to claim 2, wherein the grooves (12) run orthogonally to the stripping edge (18).

4. The apparatus according to claim 3, further comprising an ultrasonic transducer (27) for applying ultrasound to the ramp (16).

5. The apparatus according to claim 2, wherein the concave surface (17) of the ramp (16) is the surface of a cylinder the longitudinal axis of which runs parallel to the stripping edge (18).

6. The apparatus according to claim 2, further comprising a means for adjusting a height of the stripping edge (18).

7. The apparatus according to claim 2, further comprising an ultrasonic transducer (27) for applying ultrasound to the ramp (16).

8. The apparatus according to claim 1, wherein the grooves (12) run orthogonally to the stripping edge (18).

9. The apparatus according to claim 8, wherein the concave surface (17) of the ramp (16) is the surface of a cylinder the longitudinal axis of which runs parallel to the stripping edge (18).

10. The apparatus according to claim 8, further comprising a means for adjusting a height of the stripping edge (18).

11. The apparatus according to claim 8, further comprising an ultrasonic transducer (27) for applying ultrasound to the ramp (16).

12. The apparatus according to claim 1, wherein the concave surface (17) of the ramp (16) is the surface of a cylinder the longitudinal axis of which runs parallel to the stripping edge (18).

13. The apparatus according to claim 1, further comprising a means for adjusting a height of the stripping edge (18).

14. The apparatus according to claim 1, further comprising an ultrasonic transducer (27) for applying ultrasound to the ramp (16).

* * * * *